US009755368B2

(12) United States Patent
Cheng et al.

(10) Patent No.: US 9,755,368 B2
(45) Date of Patent: Sep. 5, 2017

(54) FLIPPABLE ELECTRICAL CONNECTOR

(71) Applicant: FOXCONN INTERCONNECT TECHNOLOGY LIMITED, Grand Cayman (KY)

(72) Inventors: Chih-Pi Cheng, New Taipei (TW); Wen He, Kunshan (CN); Quan Wang, Shenzhen (CN); Feng Zeng, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/377,893

(22) Filed: Dec. 13, 2016

(65) Prior Publication Data

US 2017/0093091 A1 Mar. 30, 2017

Related U.S. Application Data

(63) Continuation of application No. 15/205,006, filed on Jul. 8, 2016, now Pat. No. 9,520,677, which is a (Continued)

(30) Foreign Application Priority Data

Oct. 27, 2015 (CN) .................... 2015 2 0835946 U

(51) Int. Cl.
*H01R 24/00* (2011.01)
*H01R 13/6471* (2011.01)
(Continued)

(52) U.S. Cl.
CPC ......... *H01R 13/6471* (2013.01); *H01R 4/023* (2013.01); *H01R 13/631* (2013.01);
(Continued)

(58) Field of Classification Search
CPC ........................ H01R 23/7073; H01R 23/7005
(Continued)

(56) References Cited

U.S. PATENT DOCUMENTS 5,073,130 A * 12/1991 Nakamura ....... H01R 13/65802 439/607.32
6,755,689 B2 * 6/2004 Zhang ................. H01R 12/716 439/357

(Continued)

FOREIGN PATENT DOCUMENTS

CM CN201868687 U 6/2011
CN 1253402 A 5/2000

(Continued)

OTHER PUBLICATIONS

Universal Serial Bus Type-C Cable and Connector Specification Revision 0.7 Working Draft Jan. xx, 2014, p. 13-14, 20-21, 33, 38.

(Continued)

*Primary Examiner* — Phuongchi T Nguyen
(74) *Attorney, Agent, or Firm* — Wei Te Chung; Ming Chieh Chang

(57) ABSTRACT

A plug connector includes a connector body defining a front mating cavity with a first inner side and a second inner side opposite to the first inner side, and a rear cable supporting platform with a first surface and a second surface opposite to the first inner side and a plurality of terminals. The terminals include two rows of contacting sections arranged along the first and second inner sides of the mating cavity and soldering legs extending to the platform to be welded to a cable. The soldering legs are arranged in one row and exposing to the first surface of the platform while the second surface of the platform has no soldering legs to be welded to the cable.

20 Claims, 14 Drawing Sheets

Related U.S. Application Data continuation-in-part of application No. 15/169,004, filed on May 31, 2016, which is a continuation-in-part of application No. 14/698,876, filed on Apr. 29, 2015, now Pat. No. 9,356,400, which is a continuation-in-part of application No. 14/667,632, filed on Mar. 24, 2015, said application No. 14/698,876 is a continuation-in-part of application No. 14/558,732, filed on Dec. 3, 2014, now Pat. No. 9,490,594, said application No. 15/205,006 is a continuation-in-part of application No. 14/542,550, filed on Nov. 15, 2014, now Pat. No. 9,350,126, and a continuation-in-part of application No. 14/497,205, filed on Sep. 25, 2014, now Pat. No. 9,472,910, said application No. 15/205,006 is a continuation-in-part of application No. 14/477,889, filed on Sep. 5, 2014, now Pat. No. 9,525,223, said application No. 15/205,006 is a continuation-in-part of application No. 14/454,737, filed on Aug. 8, 2014, now Pat. No. 9,525,227, said application No. 15/205,006 is a continuation-in-part of application No. 14/337,180, filed on Jul. 21, 2014, now Pat. No. 9,318,853, said application No. 15/205,006 is a continuation-in-part of application No. 14/517,941, filed on Oct. 20, 2014, now Pat. No. 9,496,662.

(60) Provisional application No. 62/021,066, filed on Jul. 4, 2014, provisional application No. 62/002,934, filed on May 26, 2014, provisional application No. 62/026,046, filed on Jul. 18, 2014, provisional application No. 62/035,472, filed on Aug. 10, 2014, provisional application No. 61/977,115, filed on Apr. 9, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/687,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.

*H01R 24/62* (2011.01)
*H01R 4/02* (2006.01)
*H01R 13/631* (2006.01)
*H05K 1/11* (2006.01)
*H01R 107/00* (2006.01)

(52) U.S. Cl.

CPC ............. *H01R 24/62* (2013.01); *H05K 1/117* (2013.01); *H01R 2107/00* (2013.01)

(58) Field of Classification Search

USPC .................. 439/660, 626, 374, 377, 79, 733
See application file for complete search history.

(56) References Cited

U.S. PATENT DOCUMENTS 7,534,140 B2 * 5/2009 Zheng ................ H01R 23/6873 439/607.01
7,758,379 B2 * 7/2010 Chen .................. H01R 13/6485 439/607.11
7,824,219 B2 * 11/2010 Wang ............... H01R 13/65802 439/607.27
7,914,299 B2 * 3/2011 Lee .................. G06K 19/07732 439/76.1
8,087,944 B2 1/2012 Kumamoto et al.
8,087,977 B2 * 1/2012 Gallagher ............ B24B 23/022 310/62
8,517,773 B2 * 8/2013 Lee ...................... H01R 12/716 439/660
8,968,031 B2 3/2015 Simmel et al.
9,281,642 B1 3/2016 Tseng et al.
9,300,095 B2 3/2016 Lin et al.
9,312,641 B2 4/2016 Wang et al.
9,318,856 B2 4/2016 MacDougall et al.
9,379,499 B2 6/2016 Miyoshi et al.
2007/0049100 A1 3/2007 Tsai
2009/0156027 A1 * 6/2009 Chen .................. H01R 13/6485 439/83
2010/0267261 A1 * 10/2010 Lin .................... H01R 13/6461 439/218
2013/0095702 A1 * 4/2013 Golko ................ H01R 13/6273 439/676
2014/0024257 A1 * 1/2014 Castillo ............. H01R 13/6585 439/607.05
2014/0302709 A1 * 10/2014 Zhao ...................... H01R 12/57 439/519
2015/0162684 A1 6/2015 Amini et al.
2015/0171562 A1 6/2015 Gao et al.
2015/0214673 A1 7/2015 Gao et al.
2015/0214674 A1 7/2015 Simmel et al.
2015/0295362 A1 10/2015 Tziviskos et al.
2015/0340813 A1 11/2015 Ng et al.
2015/0340815 A1 11/2015 Gao et al.
2015/0340825 A1 11/2015 Ng et al.
2016/0118752 A1 4/2016 Guo et al.

FOREIGN PATENT DOCUMENTS

CN 2454802 Y 10/2001
CN 2724249 Y 9/2005
CN 2728006 Y 9/2005
CN 201029143 Y 2/2008
CN 201078847 Y 6/2008
CN 201107821 Y 8/2008
CN 201230066 Y 4/2009
CN 101573840 A 11/2009
CN 201708399 U 1/2011
CN 201717435 U 1/2011
CN 201741935 U 2/2011
CN 201741937 U 2/2011
CN 201868687 U 6/2011
CN 202076514 U 12/2011
CN 10228073213 12/2011
CN 102437482 A 5/2012
CN 102544812 A 7/2012
CN 202423735 9/2012
CN 202513384 U 10/2012
CN 202737282 2/2013
CN 103081253 A 5/2013
CN 203242848 U 10/2013
CN 103427263 A 12/2013
CN 203326282 U 12/2013
CN 203481540 U 3/2014
CN 103762479 A 4/2014
CN 203521683 4/2014
CN 204577669 U 8/2015
TW M288035 2/2006
TW M357077 5/2009
TW M391213 10/2010
TW M398256 2/2011

(56) References Cited

FOREIGN PATENT DOCUMENTS

| | | |
|---|---|---|
| TW | M398262 | 2/2011 |
| TW | M426911 | 4/2011 |
| TW | I427870 | 6/2011 |
| TW | M414692 | 10/2011 |
| TW | M443957 | 12/2012 |
| TW | M453995 | 5/2013 |
| TW | M454654 | 6/2013 |
| TW | M471688 | 2/2014 |
| TW | M475728 | 4/2014 |
| WO | WO2009147791 | 12/2009 |
| WO | WO2013/020359 | 2/2013 |

OTHER PUBLICATIONS

USB Type-C Specification 0.9c05—20140518, p. 24-44,47,53-64,84-86.

Universal Serial Bus Type-C Cable and Connector Specification Revision 1.0 Aug. 11, 2014, p. 18-19, 28-48, 51, 55, 58, 59-63, 65-67, 70, 93, 96-99.107, 110-113.

* cited by examiner 33
21
31
21D
21G
21C
21P
12
10
32

FLIPPABLE ELECTRICAL CONNECTOR

CROSS REFERENCE TO CROSS REFERENCE TO RELATED APPLICATIONS

This application is a continuation of application Ser. No. 15/205,006 filed on Jul. 8, 2016, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

USB 3.0 Promoter Group issues a new specification which establishes a new type connector named as USB Type-C Cable and Connector, on Aug. 11, 2014. In the specification, the Type-C plug enhances ease of use by being plug-able in either upside-up or upside-down directions. The plug connector connecting with a cable defines two types, one type is USB Full-Featured Type-C Plug Interface with 22 pins, another type is USB 2.0 Type-C plug with 14 pins. The plug connector is connected to the cable via paddle card, which will enhance the whole cost of the cable connector.

Hence, a new and simple electrical plug connector and the complementary receptacle connector are desired to improve those disclosed in the aforementioned proposal.

SUMMARY OF THE INVENTION

Accordingly, the object of the present invention is to provide to a plug connector comprises a connector body defining a front mating cavity with a first inner side and a second inner side opposite to the first inner side, and a rear cable supporting platform with a first surface and a second surface opposite to the first inner side and a plurality of terminals. The terminals comprise two rows of contacting sections arranged along the first and second inner sides of the mating cavity and soldering legs extending to the platform to be welded to a cable. The soldering legs are arranged in one row and exposing to the first surface of the platform while the second surface of the platform has no soldering legs to be welded to the cable.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Figure 1:
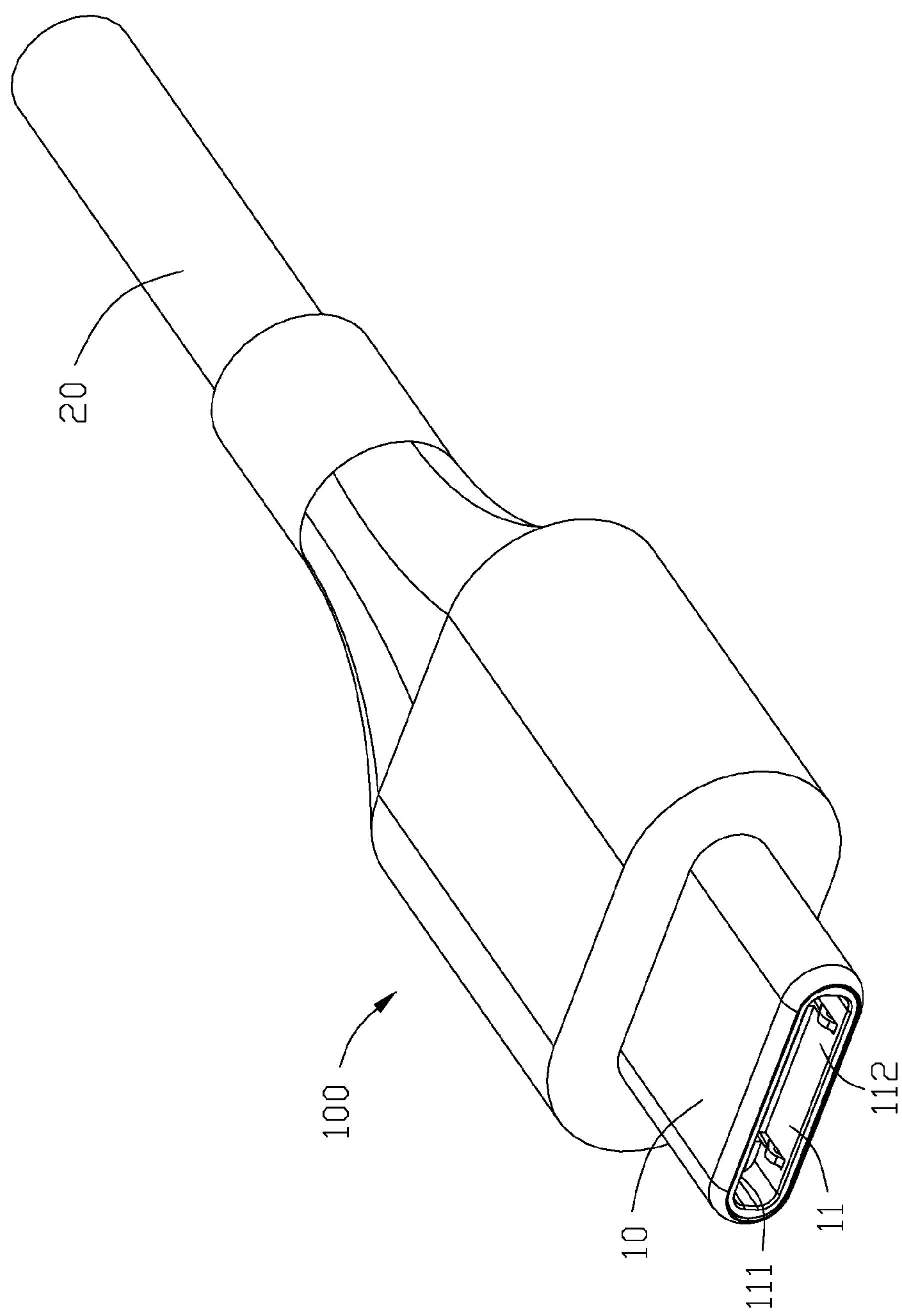
FIG. 1 is an assembled perspective view of a plug connector connecting with a cable of a first embodiment of the instant invention.
Figure 2:
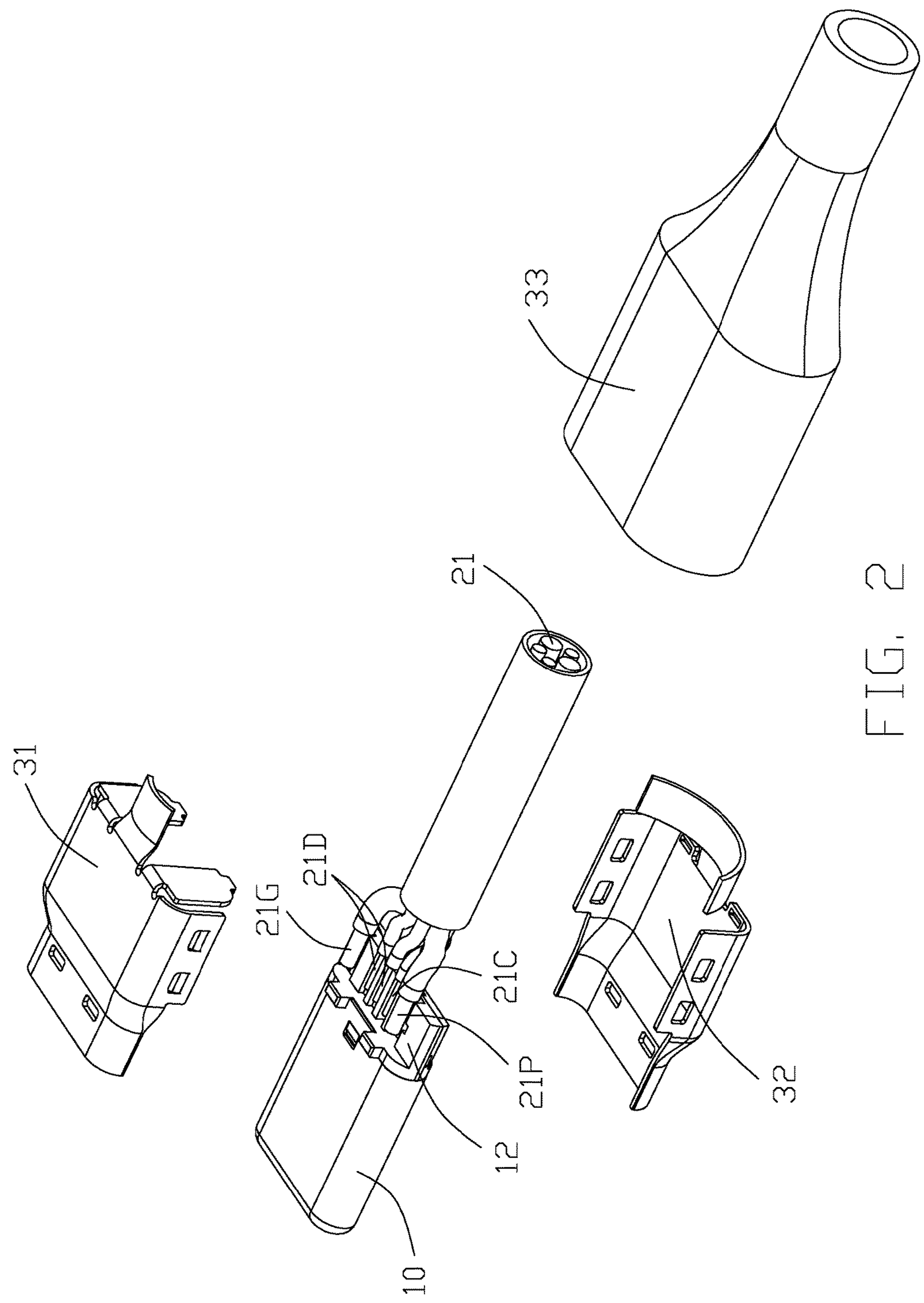
FIG. 2 is a partially exploded perspective view of the plug connector of FIG. 1.
Figure 3:
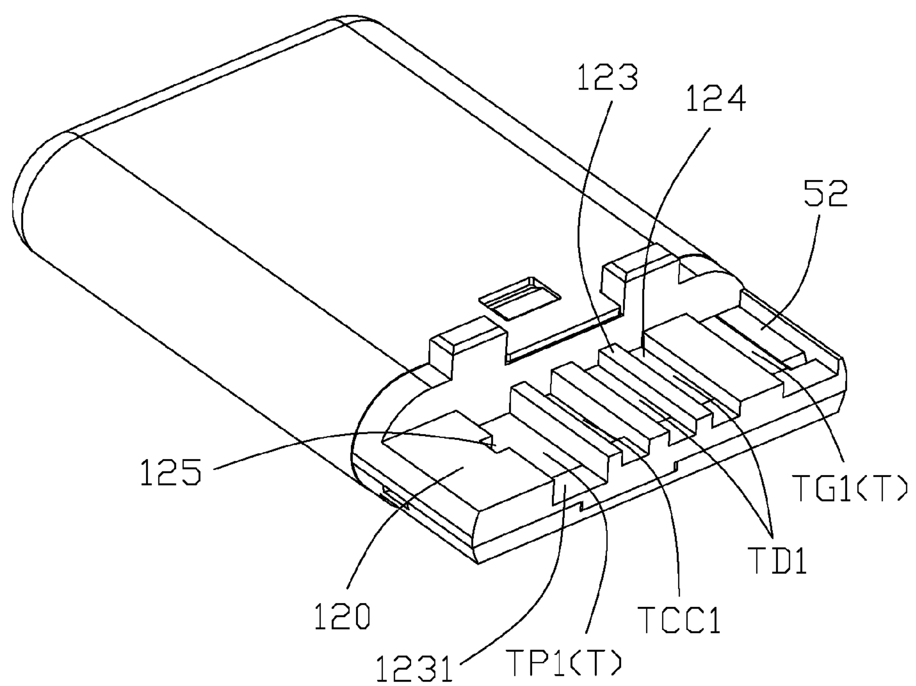
FIG. 3 is a rear and top perspective view of the connector body in FIG. 2.

Referring to FIG. 1 through FIG. 6, a USB Type C plug connector 100 of a first embodiment of this present invention is illustrated, which comprises a front connector body 10 and a rear cable 20 connecting with the connector body 10. The connector body 10 defines a front mating cavity 11 opening forwards and two rows of terminals 40 with contacting sections 41 along opposite first inner side 111 and second inner side 112 of the mating cavity 11 in a diagonally symmetrical manner. Referring to FIGS. 2 and 3, the connector body 10 defines a cable supporting platform 12 at a rear end thereof, and soldering legs TP1(T), TCC1, TD1, TG1(T) of the terminals 40 are exposed to the platform 12. Wires 21 of the cable 20 are disposed on the platform 12 and welded to the corresponding soldering legs. An upper metallic shell 31 and a lower metallic shell 32 enclose the platform 12. A molded cover 33 encloses the connector body 10 and the cable 20, thereby forming the plug connector 100.

Figure 4:
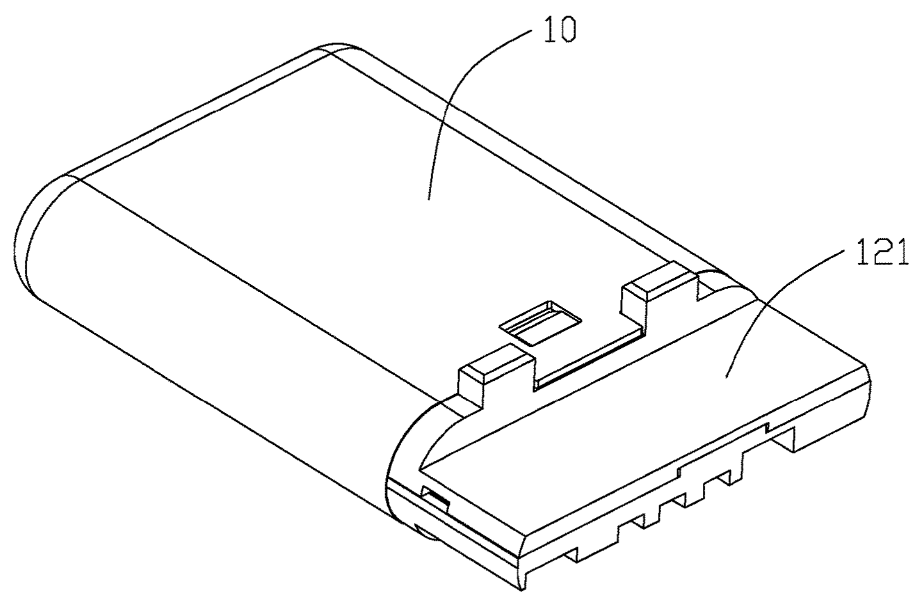
FIG. 4 is a rear and bottom perspective view of the connector body as shown in FIG. 3.
Figure 5:
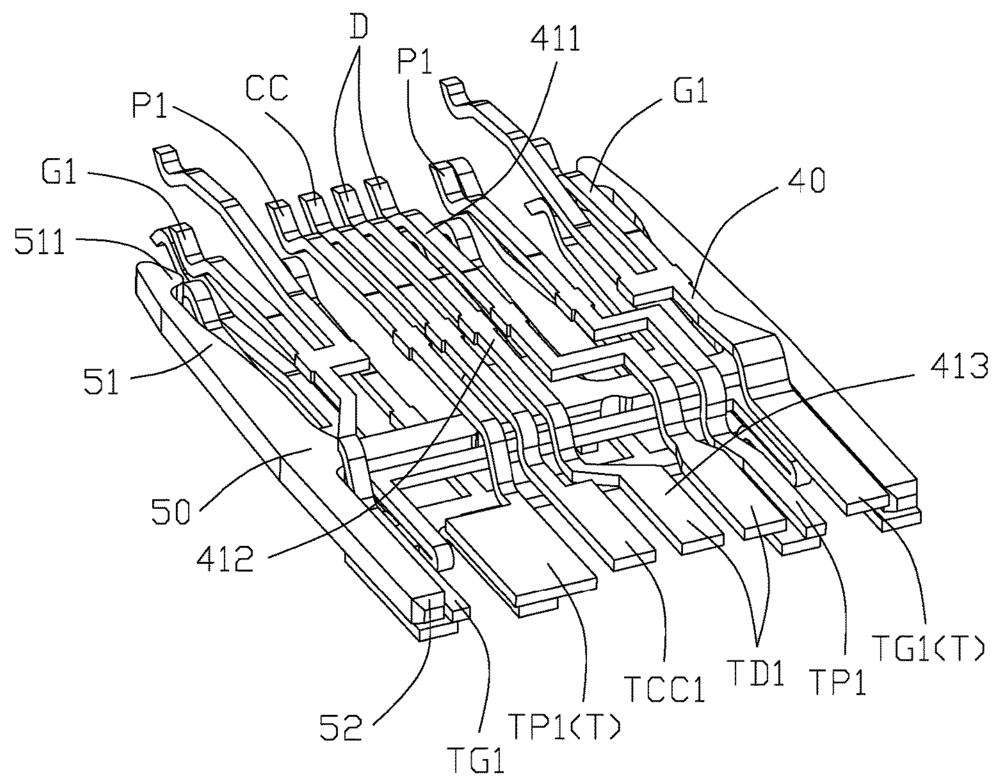
FIG. 5 is a rear and top perspective view of the terminals and the metallic latch of the connector body.
Figure 6:
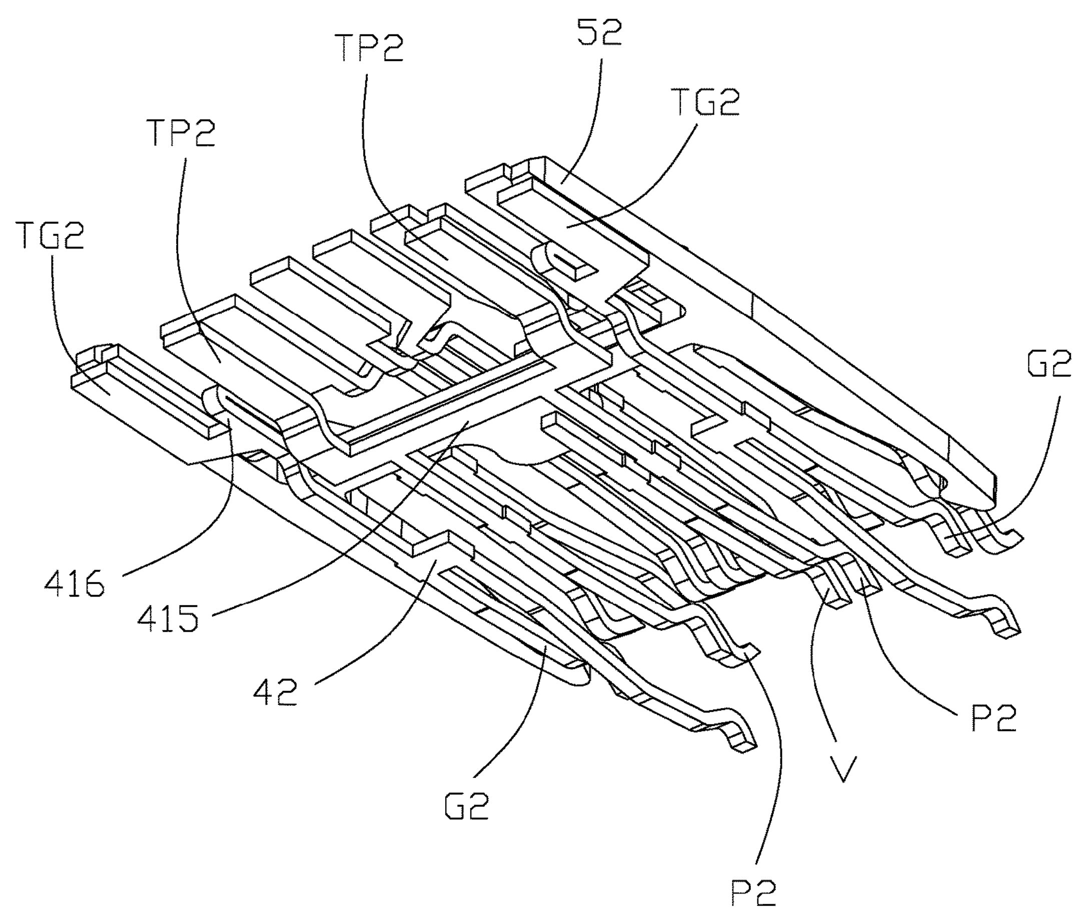
FIG. 6 is a rear and bottom perspective view of the terminals and the metallic latch of the connector body.
Figure 7:
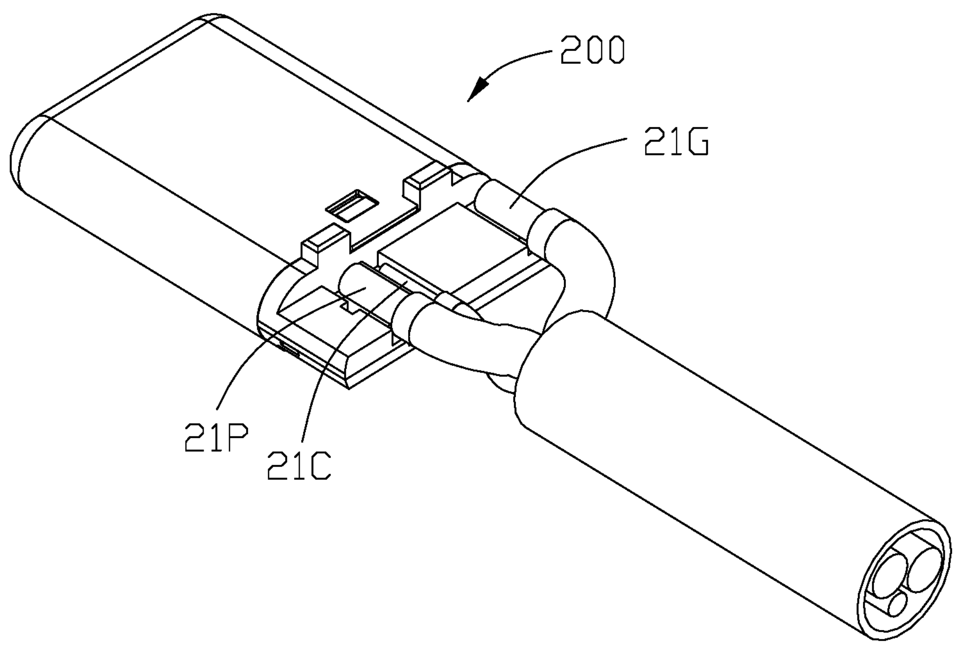
FIG. 7 is a rear and top perspective view of a plug connector connecting with a cable of a second embodiment of the instant invention without the outer molded cover.

Combination with FIGS. 3 and 4 referring to FIGS. 5 and 6, the terminals 40 are arranged to be complied with USB Type C 2.0, and divided to two rows, a first row includes a pair of grounding terminals G1, a pair of power terminals P1, a CC detecting terminal CC and a pair of USB 2.0 terminals D (including D+, D−), a second row includes a pair of grounding terminals G2, a pair of power terminals P2 and a Vconn detecting terminal V. The USB 2.0 terminals (D+, D−) and the detecting terminal CC are independent pin, each comprises a front contacting section 411, a rear leg section 413 and a middle section 412 connecting with the contacting section 411 and the leg section 413. The leg sections 413 of the USB 2.0 terminals (D+, D−) and the detecting terminal CC expose to the platform 12 and are functioned as said soldering legs TD1, TCC1 while the power and grounding terminals are not independent as described hereinafter.

The two pairs of power terminals P1, P2 have two pairs of contacting sections 411 (near to P1, P2 in FIGS. 5 and 6) and two pairs of leg sections. A first leg section TP1 extends from each of the two first power contacting sections, a second leg section TP2 extends from each of the two second power contacting section and the second power terminals are further joined together with a bridge section 415. One of said two first power leg section TP1 bends toward the second power leg sections TP2 and touches with one second power leg section TP2 in a stacked form and another second power leg section TP2 bends toward another first power leg section TP1 so that said four power leg sections are electrically connecting with each other and only one first leg section labeled as TP1(T) exposes to the first surface 120, that is, the four power contacting sections share a same power soldering leg TP1(T). The first power leg section TP1 exposes to a first surface 120 and is functioned as a power soldering leg TP1(T).

A first grounding leg section TG1 extends from a rear end of each first grounding contacting sections (near to G1 in FIGS. 5 and 6), a second grounding leg section TG2 extends from a rear end of the second grounding contacting sections (near to G2 in FIGS. 5 and 6), two second grounding leg sections TG2 further are joined together with a second bridge section 416. The first and second grounding leg sections TP1, TP2 are stacked with each other in the vertical direction so that the four grounding leg section are electrically connecting with each other. Only one first grounding leg section labeled as TG1(T) is exposed to the first surface 120 which is functioned as a grounding soldering leg TG1(T). That is, the four grounding contacting sections share a same grounding soldering leg TP1(T). Other leg sections of the power terminals and grounding terminals are wholly embedded in the platform 12.

The connector body 10 further includes a H-shape metallic latch 50, which includes a pair of side arms 51 with locking heads 511 projecting into the mating cavity 11 and two leg sections 52. The leg sections 52 and the first grounding leg sections TG1 are located side by side and abut against each other. The second grounding leg sections TG2 are stacked with the leg sections 52 in a vertical direction. Understandingly, the grounding soldering leg may be the first grounding leg section TG1, the second grounding leg section TG2 or the leg section 52 of the latch. Referring to FIGS. 3 and 4, the first surface 120 and the first inner side 111 of the mating cavity 11 are located at a same side of the connector body 10. Therefore, the first grounding leg section TG1 may be the best choice for manufacturing a same row of the terminals since the first grounding contacting section (near to G1 in FIGS. 5 and 6) and the detecting contacting section (near to CC in FIGS. 5 and 6) are located at a same side of the mating cavity 11 described hereinafter.

In the preferred embodiment, the contacting sections 411 of the terminals 40 includes a pair of USB 2.0 signal contacting sections, a pair of power contacting sections, a pair of first grounding contacting sections and a detecting contacting section commonly located at the first inner side 111 of the mating cavity 11, and a pair of second power contacting sections and a pair of second grounding contacting sections commonly located at the second inner side 112 of the mating cavity 11. The first and second power/grounding contacting sections are aligned with each other in the vertical direction. The soldering legs includes a pair of signal soldering legs TD1 respectively extending from the signal contacting sections, only one power soldering leg TP1(T) extending from the first and second power contacting sections, only one grounding soldering leg TG1(T) extending from the first and second grounding contacting sections and one detecting soldering leg TCC1 extending from the detecting contacting section. The detecting soldering leg TCC1 is located beside the pair of the signal soldering legs TD1, the grounding soldering leg TG1(T) and the power soldering leg TP1(T) are located at opposite sides of the detecting soldering leg TCC1 and the pair of the signal soldering legs TD1. Referring to FIG. 2, the wires 21 of the cable 20 includes a power wire 21P, a grounding wire 21G a pair of signal wires 21D, and a CC detecting wire 21C which are weldingly connecting with the corresponding soldering legs one by one. Understandingly, all the soldering sections are disposed directing to a same vertical direction and on a same horizontal plane, the wires 21 are arranged upon a same surface, i.e., the first surface 120 of the platform 12 without any wire of the cable on the second surface of the platform, which will facility the soldering process of the wires 21 to the soldering legs. Referring to FIG. 3, the first surface 120 further defines a plurality of recesses 124 partitioned by ribs 123 and running rearwards through the platform, which includes a grounding recess, a detecting recess and a power recess to receive corresponding wires of the cable. The soldering legs are flushed with the inner bottom 1231 of the recess 124. Therefore, the wires 21 are received and limited in the recesses 124. The power and grounding soldering legs are wider than the signal soldering legs TD1 and the detecting soldering leg TCC1 in a transverse direction perpendicular to the vertical direction and the front-rear direction. The leg sections 52 of the latch and the grounding soldering leg TG1(T) are commonly exposed to recess 124 for enlarger welding space. The first surface 120 further intentionally defines tine slits 125 beside the power soldering leg and the grounding soldering leg so as to allow solder material to be filled therein to join the corresponding leg sections, and to join the corresponding leg sections together when a soldering process is applied through a hot bar.

Figure 8:
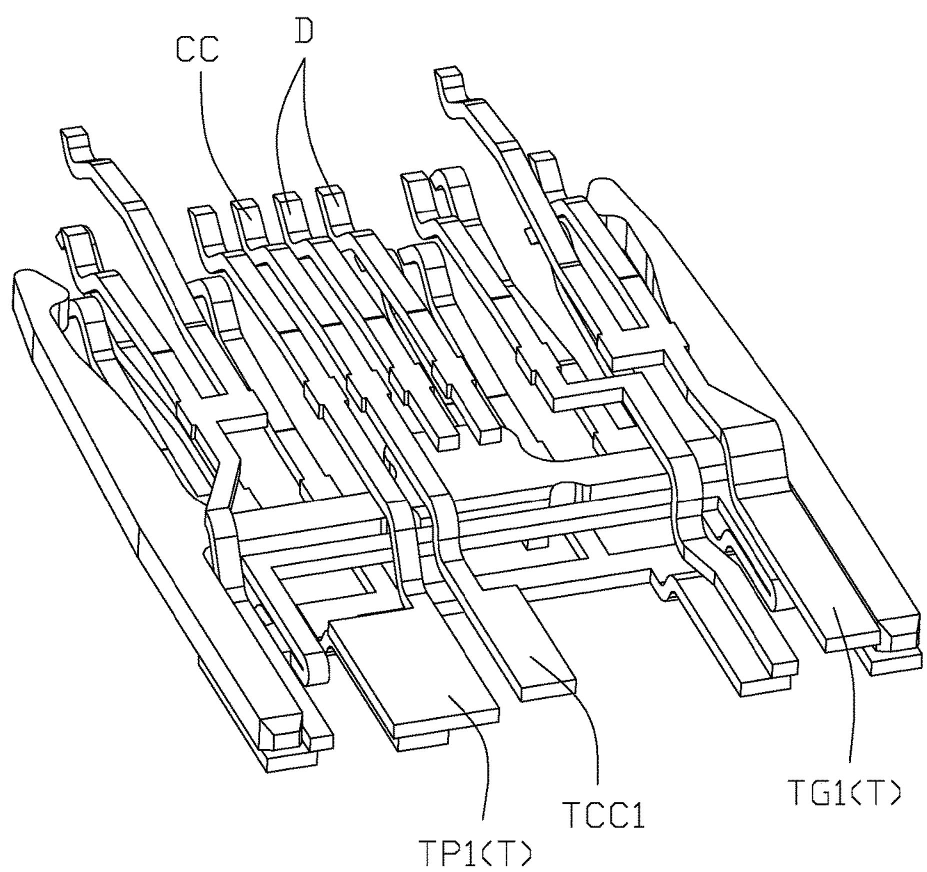
FIG. 8 is a perspective view of the terminals and the metallic latch.
Figure 9:
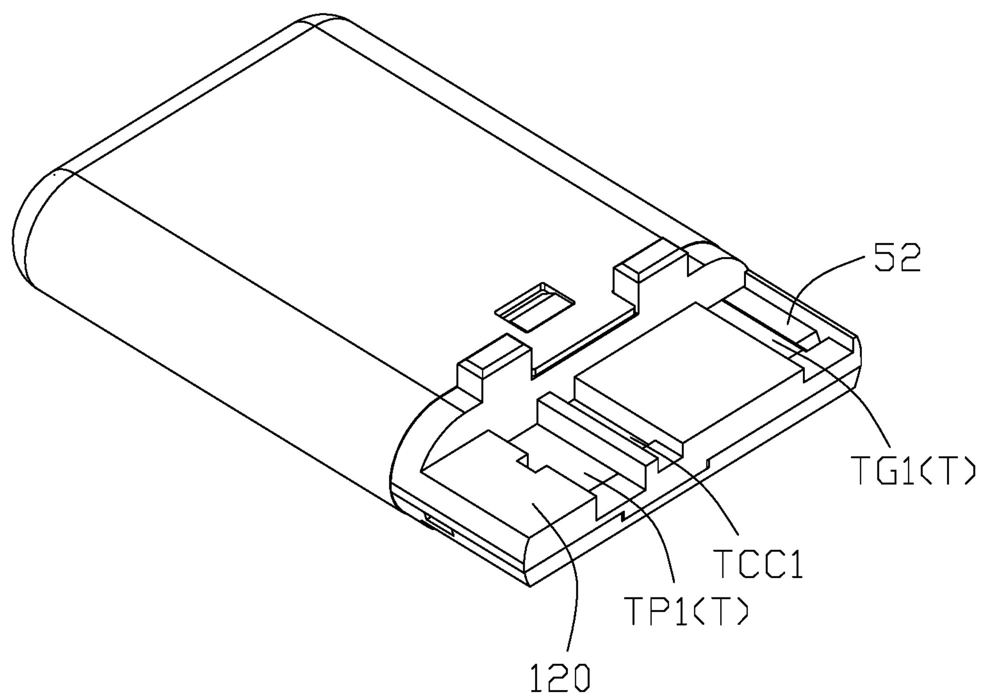
FIG. 9 is a rear and top perspective view of the connector body in FIG. 7.
Figure 10:
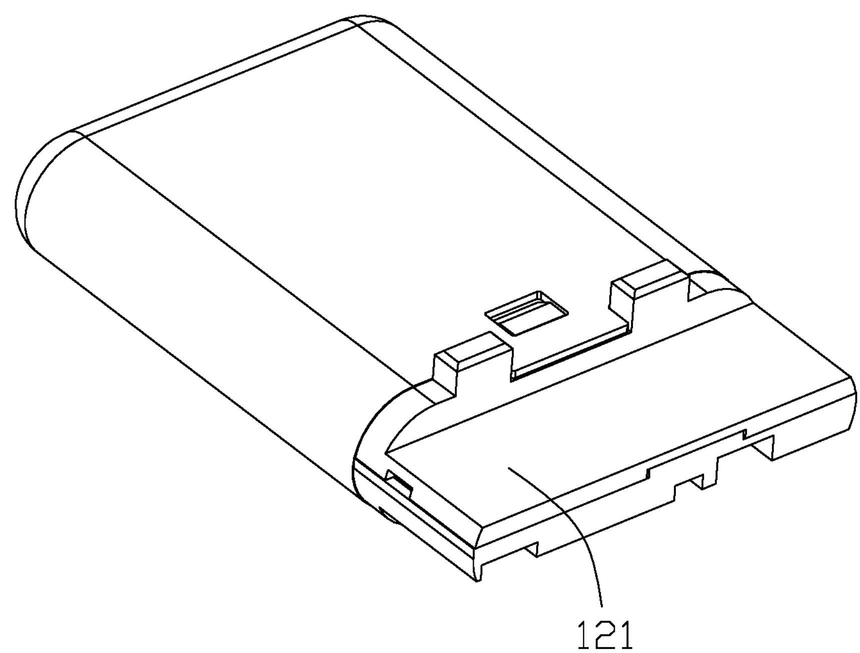
FIG. 10 is a rear and bottom perspective view of the connector body as shown in FIG. 9.
Figure 11:
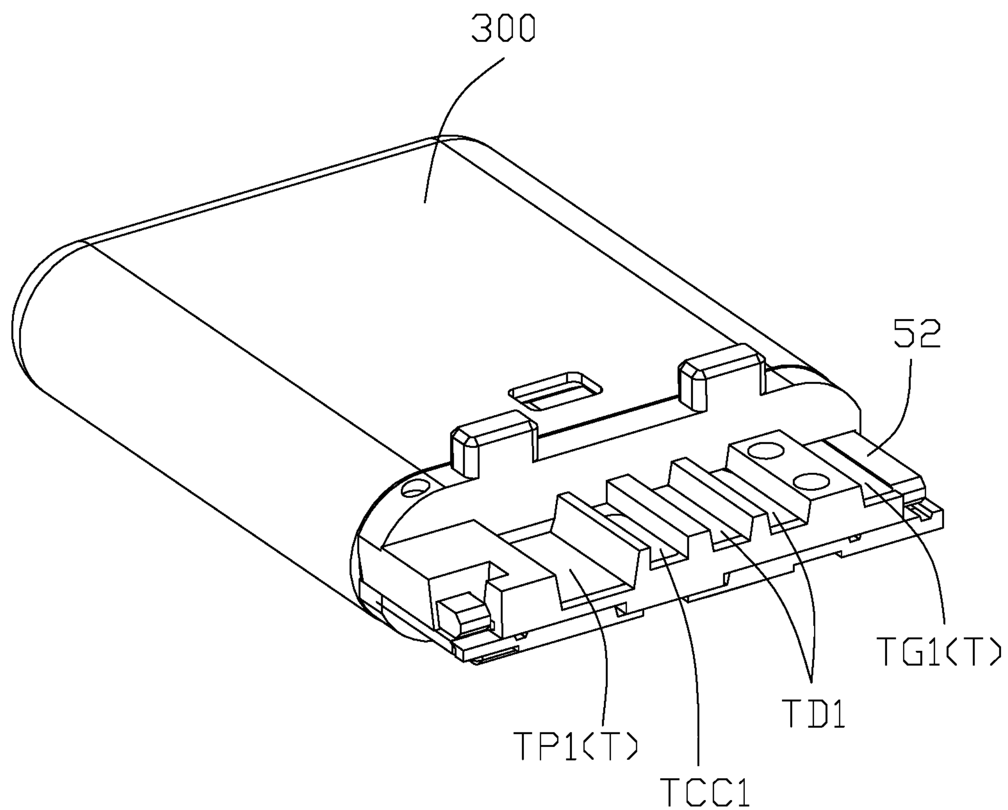
FIG. 11 is a rear and top perspective view of a plug body of a plug connector of a third embodiment of the instant invention.
Figure 12:
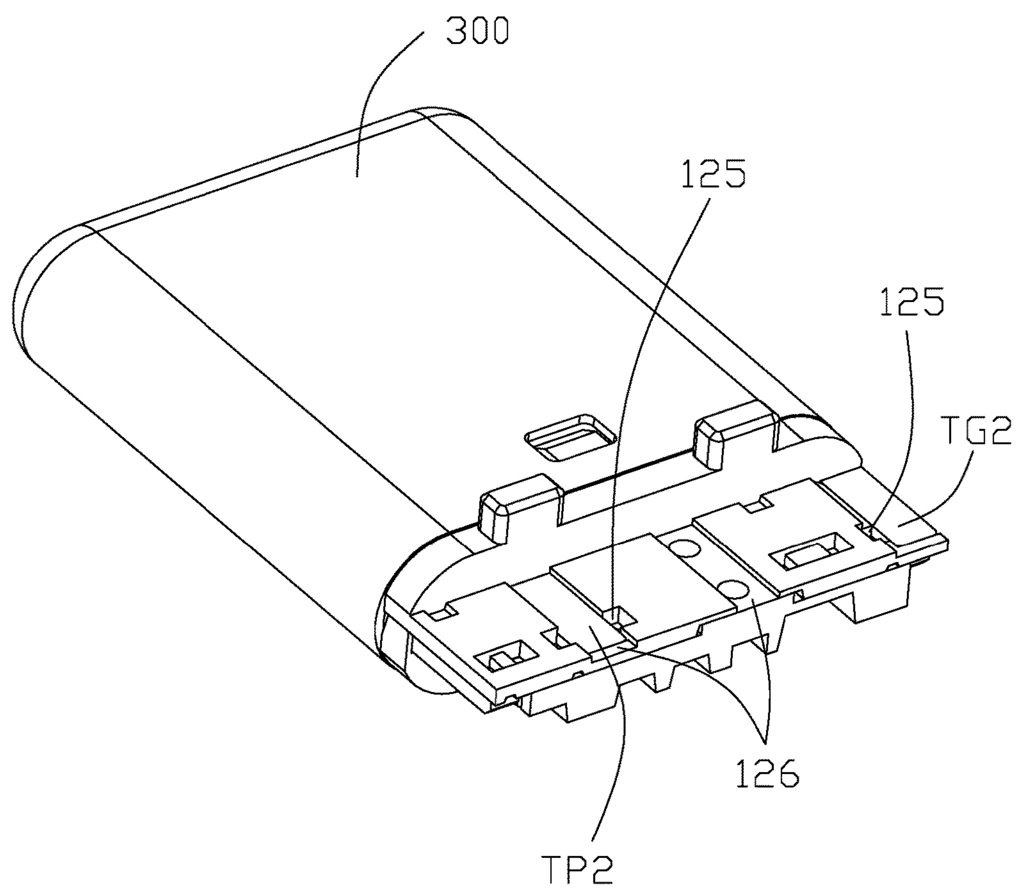
FIG. 12 is a rear and bottom perspective view of the plug body in FIG. 11.
Figure 13:
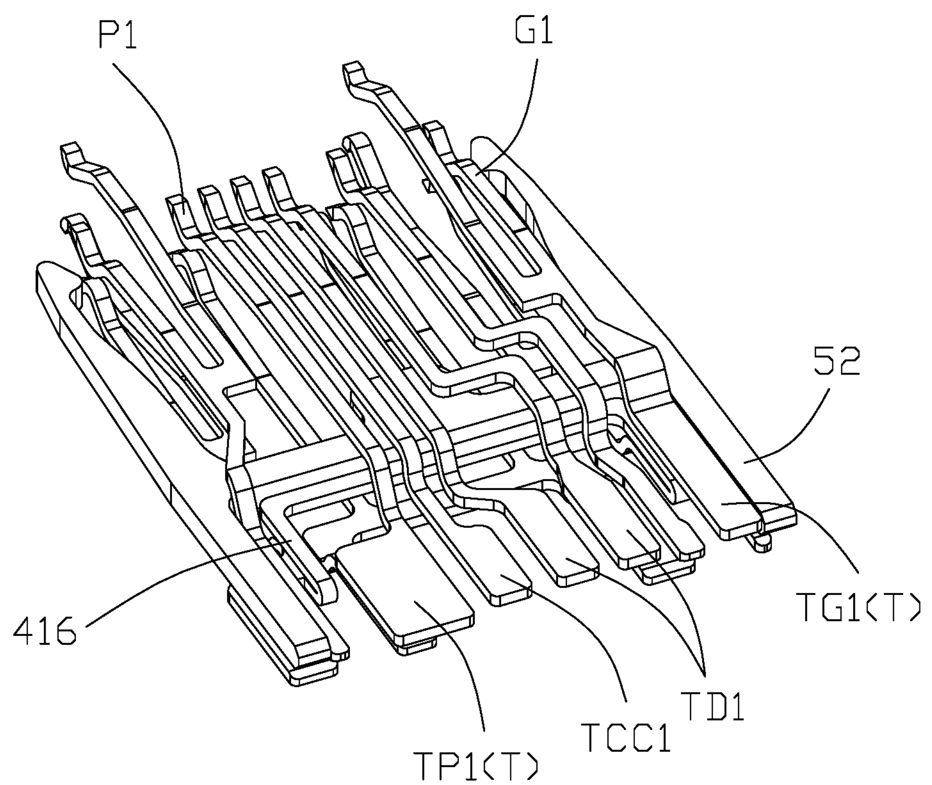
FIG. 13 is a rear and top perspective view of the terminals and the metallic latch of the connector body in FIG. 11.
Figure 14:
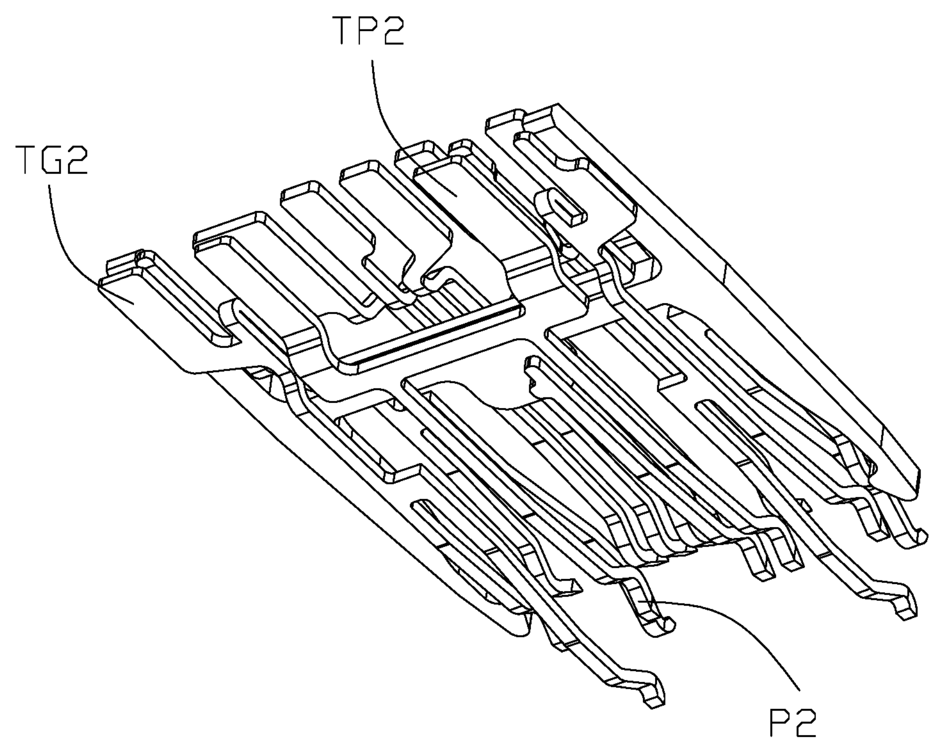
FIG. 14 is a rear and bottom perspective view of the terminals and the metallic latch of the connector body in FIG. 11.

FIGS. 7 through 10 illustrate a second embodiment of a plug connector 200 which is similar to the plug connector 100 of the first embodiment. The first surface 120 is only exposed with a power soldering leg TP1(T), a grounding soldering leg TG1(T) and a detecting soldering leg TCC1, while the second surface 121 has no soldering legs exposed. The plug connector 200 is adapted for transmission larger power which is omitted the pair of the USB 2.0 signal terminals. As shown in FIG. 8, the connector body 10 only has the signal contacting sections D without any leg sections.

FIGS. 11 through 14 illustrate a third embodiment of a plug connector 300 which is similar to the plug connector 100 of the first embodiment. The first surface 120 is exposed with a pair of signal soldering legs TD1, a power soldering leg TP1(T), a grounding soldering leg TG1(T) and a detecting soldering leg TCC1, and the second surface 121 is exposed with a grounding leg section TP2 and a grounding leg section TG2. The second power and grounding leg sections on the second surface 121 is not used to be connected with wires of the cable or a resistor, therefore, those second power and grounding leg sections are not defined as soldering legs connecting with the cable. The second surface 121 further intentionally defines some tine slits 125 beside the second power leg section and the second grounding leg section so as to allow solder material to be filled therein to join the corresponding leg sections, and to join the corresponding leg sections together when a soldering process is applied through a hot bar. Compared with connector bodies 10 of the first and second embodiment of which the second surface 121 is whole filled with resin material without any slots, the slits 125 and the exposed leg sections benefit to manufacture of the connector body and the steady connecting of all the power/grounding leg sections. The second surface 121 further defines shallow recesses 126, but the shallow recesses 126 are not enough larger to receive the wires of the cable. Alternatively, other leg sections also can be exposed to the second surface, but said other leg sections has no functions of soldering legs.

However, the disclosure is illustrative only, changes may be made in detail, especially in matter of shape, size, and arrangement of parts within the principles of the invention.

What is claimed is:

1. A plug connector comprising:

a cable comprising a power wire, a grounding wire and a detecting wire;

a connector body defining a front mating cavity with a first inner side and a second inner side opposite to the first inner side in a vertical direction, and a rear cable supporting platform with a first surface and a second surface opposite to the first inner side;

a pair of first power contacting sections, a pair of first grounding contacting sections and a detecting contacting section located on the first inner side of the mating cavity along a transverse direction;

a pair of second power contacting sections, a pair of second grounding contacting sections located on the second inner side of the mating cavity along the transverse direction;

wherein the first and the second grounding contacting sections are aligned with each other in the vertical direction, the first and the second power contacting sections are aligned with each other in the vertical direction, the first and second grounding contacting sections are electrically connecting with each other and simplify to a power soldering leg, the first and second grounding contacting sections are electrically connecting with each other and simplify to a grounding soldering leg, a detecting soldering leg extends from the detecting contacting section; the power soldering section and the grounding soldering section are located at opposite sides of the detecting soldering sections;

wherein the platform further defines a plurality of recesses recessed from the first surface and running through a rear end thereof, and the power, grounding and detecting wires of the cable are received in corresponding recesses respectively and welded to corresponding grounding, power and grounding soldering sections exposed to corresponding recesses without any wire of the cable on the second surface of the platform.

2. The plug connector as claimed in claim 1, wherein all the soldering sections are disposed directing to a same vertical direction.

3. The plug connector as claimed in claim 1, wherein the power recess is deeper than the grounding recess in the vertical direction.

4. The plug connector as claimed in claim 1, further comprising a metallic latch, wherein the metallic latch comprises pair of side arms with locking heads protruding into the mating cavity, the metallic latch are electrically connecting with the grounding soldering leg.

5. The plug connector as claimed in claim 1, wherein all the soldering sections are disposed on a same horizontal plane.

6. The plug connector as claimed in claim 1, further comprising a metallic latch, wherein the metallic latch comprises pair of side arms with locking heads protruding into the mating cavity.

7. The plug connector as claimed in claim 1, wherein all the soldering sections are directing to a same vertical direction.

8. The plug connector as claimed in claim 1, further comprising a metallic latch, wherein the metallic latch comprises pair of side arms with locking heads protruding into the mating cavity.

9. The plug connector as claimed in claim 8, wherein the metallic latch comprises a leg section, the leg section is abutted against the grounding soldering leg in a side by side pattern.

10. The plug connector as claimed in claim 1, wherein a ground recess of said recesses receiving corresponding grounding wire and a power recess of said recesses receiving corresponding power wire of the cable, are wider than a detecting recess of said recesses receiving corresponding detecting wire in the transverse direction.

11. The plug connector as claimed in claim 10, wherein the power recess and the power recess are deeper than the detecting recess in the vertical direction.

12. The plug connector as claimed in claim 1, wherein the platform defines a grounding recess, a power recess and a detecting recess recessed from the first surface thereof to receive corresponding wires of the cable, the grounding and power recesses not only deeper in the vertical direction, but also wider in the transverse direction than the detecting recess.

13. The plug connector as claimed in claim 12, wherein the power recess is deeper than the grounding recess in the vertical direction.

14. The plug connector as claimed in claim 1, wherein the second surface is exposed with a power leg section and a grounding leg section extending from corresponding contacting sections, which leave unused.

15. The plug connector as claimed in claim 14, wherein the power and grounding soldering legs are flushed with inner bottoms of the recesses.

16. The plug connector as claimed in claim 15, wherein the cable only comprises a pair of USB 2.0 signal wires, a power wire, a grounding wire and a detecting wire welded to corresponding soldering legs on the first surface of the platform.

17. A plug connector comprising:

a cable with a grounding wire, a power wire and a detecting wire;

a connector body defining a front mating cavity with a first inner side and a second inner side opposite to the first inner side in a vertical direction, and a rear cable supporting platform with a first surface and a second surface opposite to the first inner side;

a pair of first power contacting sections, a pair of first grounding contacting sections and a detecting contacting section located on the first inner side of the mating cavity along a transverse direction;

a pair of second power contacting sections, a pair of second grounding contacting sections located on the second inner side of the mating cavity along the transverse direction;

wherein the first and the second grounding contacting sections are aligned with each other in the vertical direction, the first and the second power contacting sections are aligned with each other in the vertical direction, the first and second grounding contacting sections are electrically connecting with each other and simplify to a power soldering leg, the first and second grounding contacting sections are electrically connecting with each other and simplify to a grounding soldering leg, a detecting soldering leg extends from the detecting contacting section; the power soldering section and the grounding soldering section are located at opposite sides of the detecting soldering sections;

wherein all the grounding soldering section, power soldering section and the detecting soldering section are exposed to the first surface of the platform and directing to a same vertical direction to be welded with corresponding wires of the cable.

18. The plug connector as claimed in claim 17, wherein the power and grounding soldering legs are flushed with inner bottoms of the recesses.

19. A plug connector comprising:

a connector body defining a front mating cavity with a first inner side and a second inner side opposite to the first inner side in a vertical direction, and a rear cable supporting platform with a first surface and a second surface opposite to the first inner side;

a pair of first power contacting sections, a pair of first grounding contacting sections, a pair of USB 2.0 contacting sections and a detecting contacting section located on the first inner side of the mating cavity along a transverse direction;

a pair of second power contacting sections, a pair of second grounding contacting sections located on the second inner side of the mating cavity along the transverse direction;

wherein the first and the second grounding contacting sections are aligned with each other in the vertical direction, the first and the second power contacting sections are aligned with each other in the vertical direction, the first and second grounding contacting sections are electrically connecting with each other and simplify to a power soldering leg, the first and second grounding contacting sections are electrically connecting with each other and simplify to a grounding soldering leg, a detecting soldering leg extends from the detecting contacting section, a pair of USB 2.0 soldering legs extend from corresponding USB 2.0 contacting sections, respectively;

wherein all the grounding soldering section, power soldering section, USB 2.0 contacting sections and the detecting soldering section are exposed to the first surface of the platform to be welded with corresponding wires of the cable.

20. The plug connector as claimed in claim 19, wherein the power soldering leg and the grounding soldering legs are located at opposite of the detecting soldering leg, the pair of USB 2.0 soldering leg are located between the detecting soldering leg and the grounding soldering leg.

* * * * *